United States Patent [19]

Blecher et al.

[11] Patent Number: 5,586,437
[45] Date of Patent: Dec. 24, 1996

[54] MRI CRYOSTAT COOLED BY OPEN AND CLOSED CYCLE REFRIGERATION SYSTEMS

[75] Inventors: Leo Blecher, Schenectady, N.Y.; Ralph C. Longsworth, Allentown, Pa.; F. Scott Murray, Schenectady; Philip A. Jonas, Albany, both of N.Y.; Michael Boiarski, Moscow, Russian Federation

[73] Assignee: Intermagnetics General Corporation, Latham, N.Y.

[21] Appl. No.: 524,400

[22] Filed: Sep. 6, 1995

[51] Int. Cl.$^6$ .................................................... F17C 5/02
[52] U.S. Cl. ........................................... 62/47.1; 62/51.1
[58] Field of Search ................................... 62/47.1, 51.1

[56] References Cited

U.S. PATENT DOCUMENTS

| | | | |
|---|---|---|---|
| 4,277,949 | 7/1981 | Longsworth | 62/47.1 |
| 4,279,127 | 7/1981 | Longsworth | 62/47.1 |
| 4,766,741 | 8/1988 | Bartlett et al. | 62/47.1 |
| 4,790,147 | 12/1988 | Kuriyama et al. | 62/47.1 |
| 4,796,433 | 1/1989 | Bartlett | 62/47.1 |
| 5,339,650 | 8/1994 | Hakamada et al. | 62/51.1 |
| 5,381,666 | 1/1995 | Saho et al. | 62/47.1 |

OTHER PUBLICATIONS

Longsworth and Boiarski, New Smart Gaseous Material for Cryogenic Applications–Apr. 26, 1995, pp. 1–4.
Longsworth Boiarski and Klusmier, 80K Closed Cycle Throttle Refrigerator, Jun. 1994, pp. 1–5.

Primary Examiner—Ronald C. Capossela
Attorney, Agent, or Firm—Helfgott & Karas, P.C.

[57] ABSTRACT

A MRI cryostat, which contains a superconducting magnet operating in a bath of liquid helium, reduces the boil-off rate of helium by intercepting most of the heat in-leakage by means of a throttle cycle (TC) refrigerator operating at a low side temperature of about 90K. The main heat exchanger for the throttle cycle refrigerator is located within or immediately adjacent to the cryostat housing and delivers cold liquid to a cold heat exchanger that is in thermal contact with an outer radiation shield, support struts, neck tube and electrical leads inside the cryostat. Heat is intercepted by the outer shield from essentially all paths between a 300K ambient and a 4K load temperature, which temperature results from liquid helium boil-off to atmosphere. A second, inner radiation shield at 35K is cooled by gaseous helium that boils from the liquid helium bath. There are no moving parts of the refrigeration system in the cryostat. Thus, vibration, noise and disturbance of the magnetic field are reduced. The refrigerator installation is small and low in cost; power consumption is reduced relative to the prior art.

22 Claims, 8 Drawing Sheets

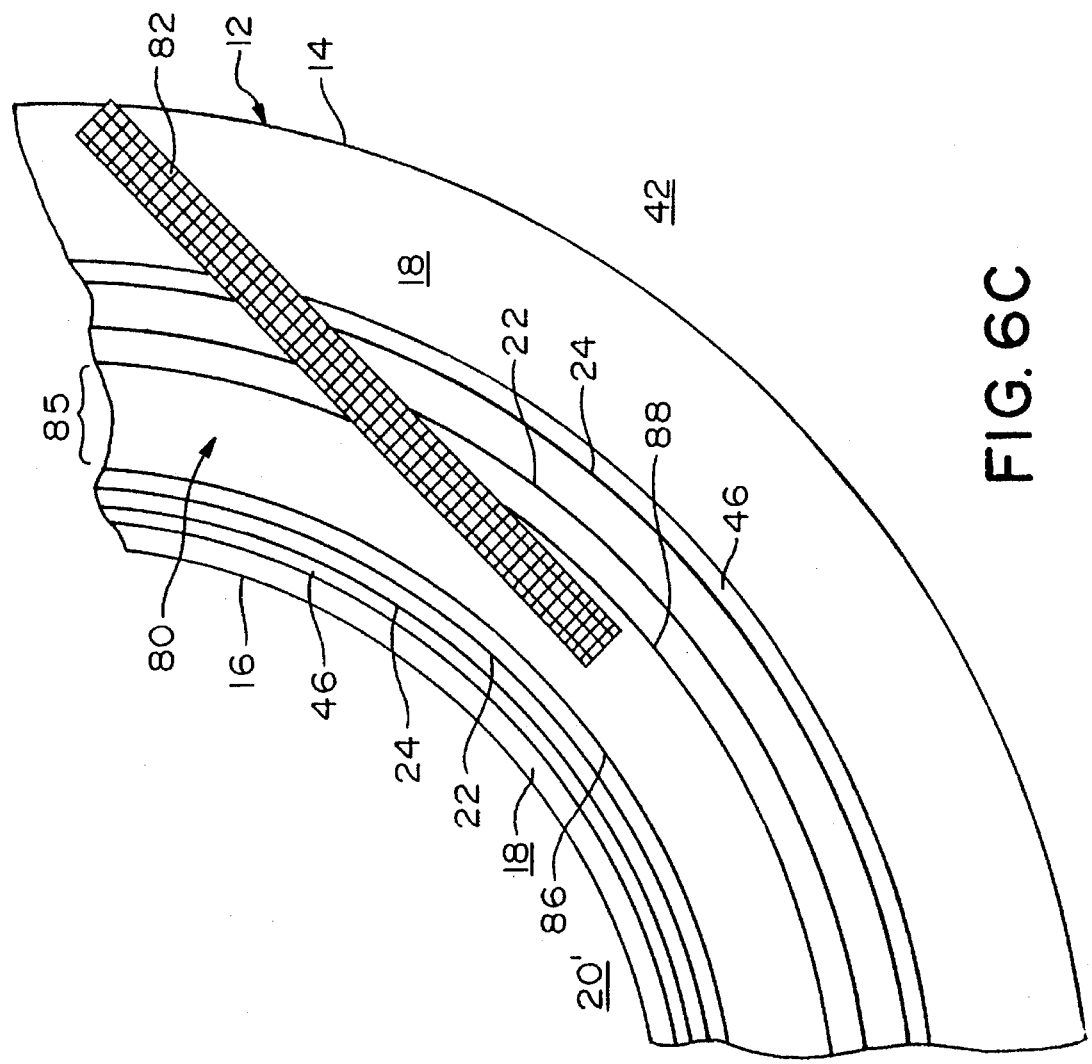

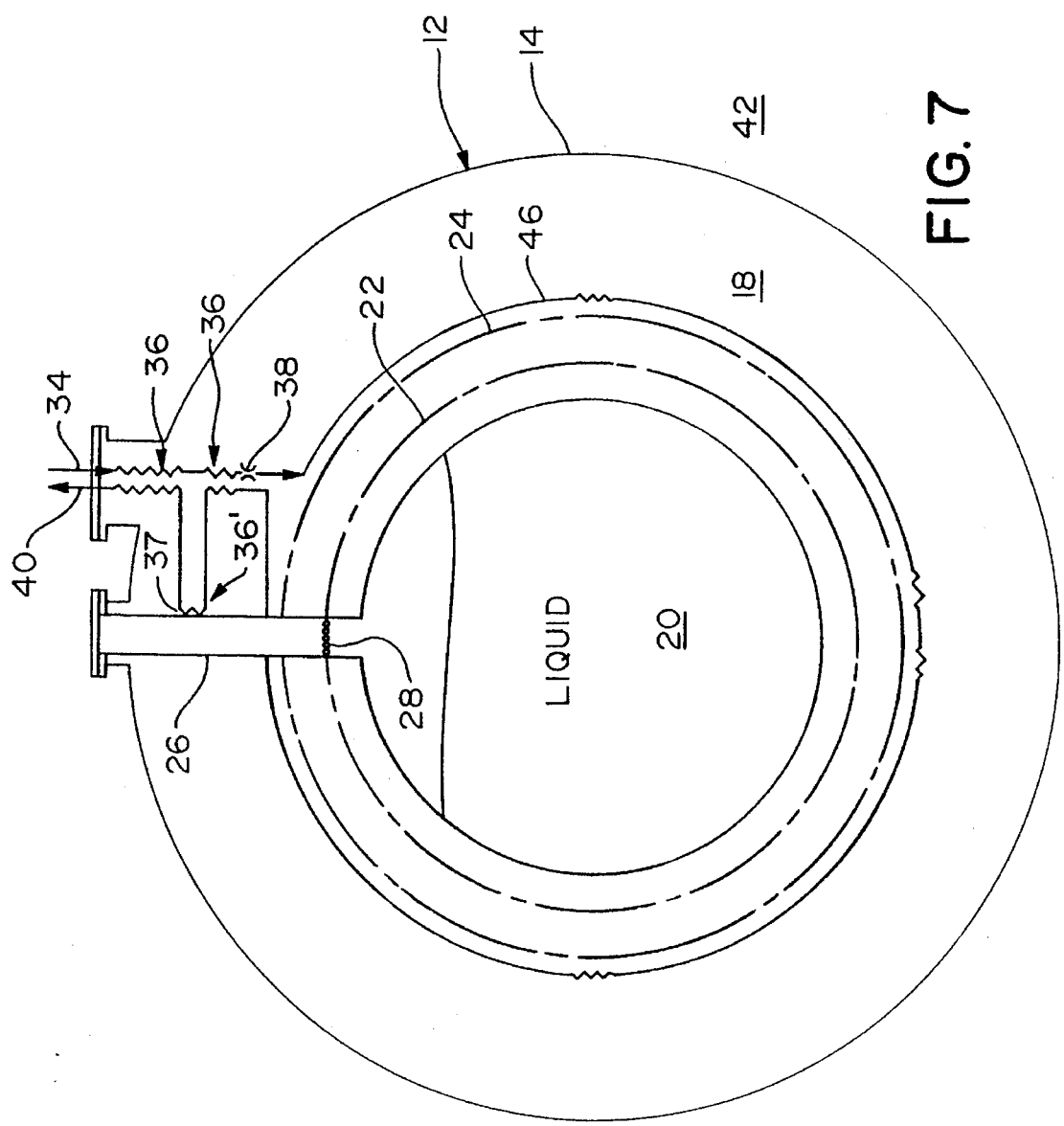

MRI CRYOSTAT COOLED BY OPEN AND CLOSED CYCLE REFRIGERATION SYSTEMS

BACKGROUND OF THE INVENTION

This invention relates generally to a cryostat, and more particularly to a MRI cryostat that intercepts in-leakage of thermal energy at an intermediate temperature between cryostat load temperature and ambient temperature by using a closed throttle cycle refrigeration system in conjunction with a conventional open cycle cryogenic refrigeration system.

The desire to reduce health care costs has resulted in studies to reduce the costs of MRI systems. The basic problem in all cryostats is removal of load generated heat and/or heat which leaks in from the higher ambient temperature.

In a cryostat for magnetic resonance imaging (MRI), which contains a superconducting magnet, the magnet operates in a bath of liquid helium that vents to ambient in gaseous form as it absorbs heat. Thereby, the magnet may be maintained at a temperature in the order of 4K. To reduce the boil-off of liquid helium, present MRI cryostats typically use two-stage GM cycle refrigerators to cool shields and to intercept heat leakage at temperatures of about 60K and 15K. This construction has reduced liquid helium boil-off rate to a point where refill of the cryostat is necessary only about once a year. U.S. Pat. No. 4,606,201 describes a GM/JT (Joule-Thomson) refrigerator that mounts in a neck tube of a helium cryostat, intercepts heat leakage at two temperature levels above 4K, and recondenses helium at 4K. In many applications, it has been found economical to omit the 4K JT cold stage and use two stages of cooling that are available from a GM expander.

Use of the two-stage GM refrigerator substantially reduces consumption of helium through boil-off. However, the refrigeration system is both complex and expensive and draws high electrical power. Additionally, noise, vibration and disturbance of the magnetic field due to the use of the GM refrigerator weigh against usage of such systems in many applications.

What is needed is a MRI cryostat construction that reduces boil-off of liquid helium and uses a closed cycle refrigeration system having relatively low power consumption and operating without introduction of noise and vibration into the cryogenic and magnetic systems.

SUMMARY OF THE INVENTION

Accordingly, it is an object of the invention to provide an improved cryostat, e.g., for cooling a superconducting magnet in an MRI application, that locates moving elements outside the cryostat.

Another object of the invention is to provide an improved MRI cryostat by means of a closed throttle cycle refrigeration system with one single stage compressor operating at a relatively high temperature (90K) to intercept heat leakage between ambient temperature and cryostat load temperature, while using boil-off gas to intercept heat at a second lower temperature of 35K.

Yet another object of the invention is to provide an improved cryostat that is less costly and complex to install and operate.

In accordance with the invention, a MRI cryostat, which contains a superconducting magnet operating in a bath of liquid helium, reduces the boil-off rate of helium by intercepting most of the heat in-leakage by means of a throttle cycle (TC) refrigerator operating at a cold end temperature of about 90K. The main heat exchanger for the throttle cycle refrigerator is located within or immediately adjacent to the cryostat housing and delivers cold liquid to a cold heat exchanger that is in thermal contact with an outer radiation shield, support struts, neck tube and electrical leads of the cryostat. Heat is intercepted by the outer shield from essentially all paths between a 300K ambient and a 4K load temperature, which temperature results from liquid helium boil-off to atmosphere.

A second, inner radiation shield at 35K is cooled by gaseous helium that boils from the liquid helium bath.

There are no moving parts of the refrigeration system in the cryostat. Thus, vibration, noise and disturbance of the magnetic field are reduced. The refrigerator installation is small and low in cost; power consumption is reduced relative to the prior art. The compact closed cycle refrigeration system reduces boil off of liquid helium although not to the low levels achieved with two stage GM refrigerators. Nevertheless, the invention provides the least expensive system when considering initial installation and costs over the expected system life.

The invention accordingly comprises the features of construction, combinations of elements, an arrangements of parts, which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 6C is an enlarged portion of FIG. 6A; and FIG. 7 is a schematic drawing of another liquid helium cryostat in accordance with the invention.

DESCRIPTION OF PREFERRED EMBODIMENTS

Figure 1:
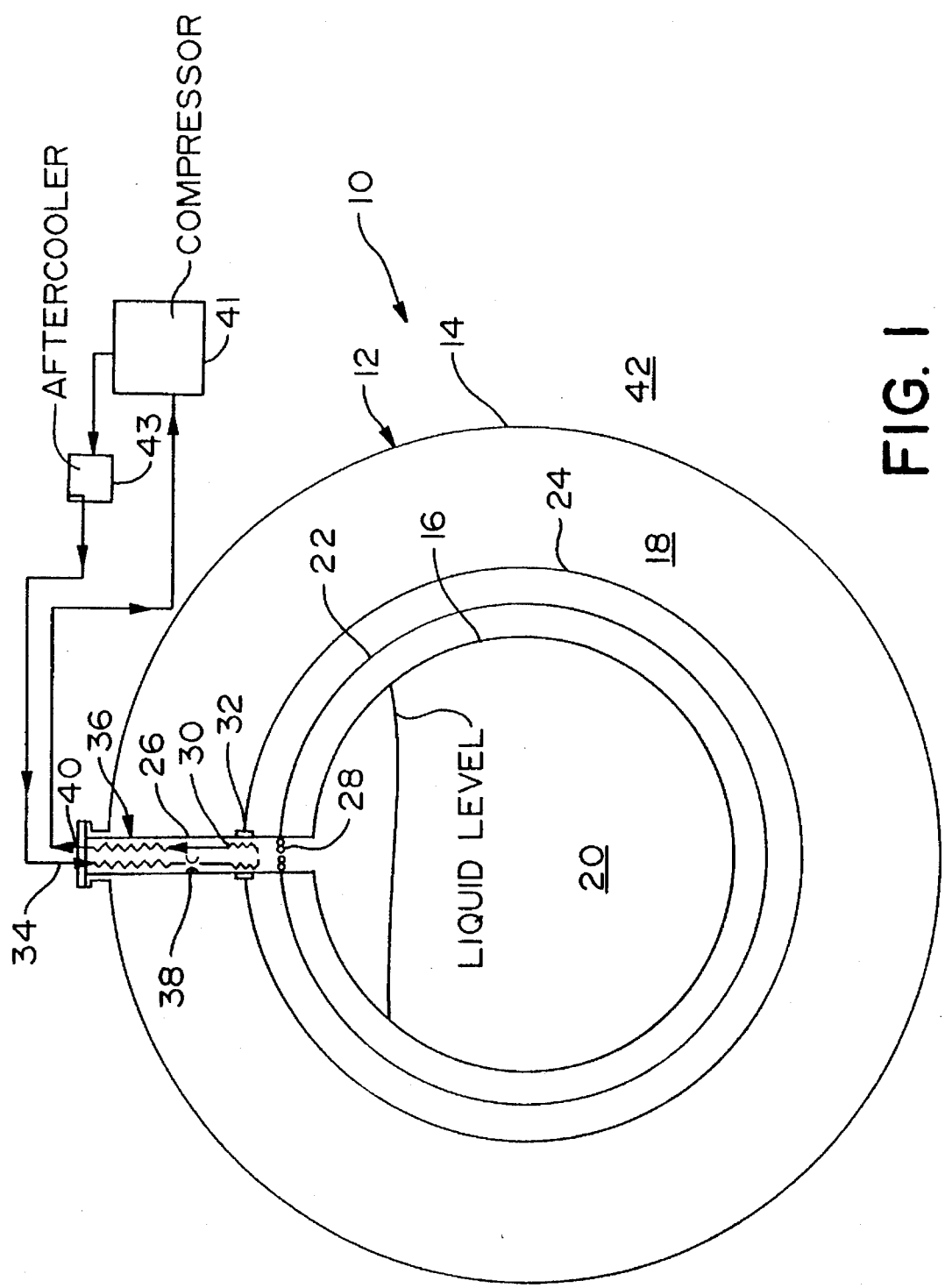
FIG. 1 is a schematic of a liquid helium cryostat with a throttle cycle refrigerator in accordance with the invention.

With reference to FIG. 1, a cryostat system 10 includes a housing 12 having a sealed outer wall 14, a sealed inner wall 16, and an evacuated space 18 between the walls 14, 16. This is a schematic representation. Accordingly, the housing 12 may be realized, for example, as an annular cylinder with a hollow tubular center that is blocked off at its ends to establish an internal liquid refrigerant storage volume 20. On the other hand, the cryostat system 10 may be, for example, spherical with spherical outer and inner walls 14, 16 and a spherical liquid refrigerant storage volume 20. The contours of the housing are not so limited and may have other shapes, e.g., FIG. 1 may represent a single cross section through a toroidal loop, and other cross sections, e.g., oval, rectangular, polygonal, may be utilized.

An inner thermal radiation barrier, shield, or intercept 22 within the evacuated space 18, surrounds the liquid refrigerant storage volume 20. An outer thermal radiation barrier, shield, or intercept 24 is concentric with the inner radiation barrier 22 and is located between the inner barrier 22 and the outer wall 14. A neck tube 26 extends from the liquid refrigerant storage volume 20 to the outside 42 of the cryostat system 10 and is used for filling the storage volume 20 with liquid refrigerant when the cryostat is in use. Also, boil-off of the liquid refrigerant, i.e. a change in phase from liquid to gaseous state, results in a low level flow of refrigerant gas from the storage volume 20 to the external ambient. In some systems, the gaseous refrigerant may be collected and recondensed.

A heat exchange element 28 located in the neck tube 26 connects to the inner thermal radiation barrier 22 and is cooled by outflow of the low temperature evaporated refrigerant from the storage volume 20 as the refrigerant therein absorbs heat. By connection of the heat exchange element 28 to the inner thermal intercept 22, a conductive heat transfer path is provided by which the inner thermal radiation intercept 22 is conductively cooled. Location of the heat exchange element 28 in the neck tube 26 partially obstructs this passage but does not prevent escape of the evaporated liquid refrigerant.

A heat exchanger 30 within the neck tube 26 has a heat exchange relationship (at 32) with the outer thermal radiation barrier 24 and thereby draws heat from the barrier 24 by conduction. The heat exchanger 30 is the evaporator in a closed vapor compression cycle that is only partially illustrated in FIG. 1. A cryogenic refrigerant that may be entirely gas at high pressure, or partially liquid and gas at high pressure, flows during steady state operation to an inlet 34 of a counterflow heat exchanger 36, then through a throttle device 38 whereby the refrigerant pressure is reduced. Cold refrigerant leaving the throttle device 38 flows through the heat exchanger/evaporator 30, then at low pressure flows back through the counterflow heat exchanger 36, and leaves the cryostat system 10 at the outlet 40. In the known manner, refrigerant leaving the outlet 40 at low pressure is input to a compressor 41 in a gaseous state. The gas is compressed to an elevated temperature and pressure; heat is removed in an air or water cooled aftercooler 43, and the refrigerant returns to the heat exchanger inlet 34 to complete a closed cycle. As is known in the art, the cycle may also include an oil separator, adsorber, filters, etc. A throttle cycle refrigerator, as described in U.S. Pat. No. 5,337,572, is suited to cryogenic applications described herein and the patent is incorporated herein by reference.

The refrigerant, which is cold upon leaving the throttle device 38 cools the outer thermal intercept 24 as a result of the heat exchange relationship with the heat exchanger/evaporator of the closed cycle at the heat station 32.

In a typical application, the liquid refrigerant in the volume 20 would absorb heat from a load (not shown). In a known application, a superconducting magnet is submerged in liquid refrigerant, generally helium, so as to maintain its superconducting state. Such a magnetic device generates little heat but it is imperative that the temperature of the magnet be maintained at the desired cryogenic level. Heat leakage from the external ambient 42 to the liquid refrigerant in the storage volume 20 is a primary source of thermal load. Additionally, there is heat conducted inwardly through the neck tube 26, internal supports for the magnet (not shown), instrumentation wiring and connections to the magnet, etc.

In a construction for cooling a superconducting magnet, in accordance with the invention, liquid helium at about 4K substantially fills the liquid refrigerant storage volume 20. The external wall 14 is at about 300K. Evaporating helium at 4K leaves the cryostat system 10 through the neck tube 26. In so doing, the heat exchanger element 28 is cooled, whereby the inner thermal intercept 22 is held at a temperature of approximately 35K. The closed cycle refrigeration system using known cryogenic refrigerant mixtures maintains the heat exchanger 30 at a low temperature whereby the outer thermal intercept 24 is maintained at about 90K. Heat exchange relationships are also provided between the instrumentation wiring, support struts, etc. that constitute an actual cryostat system.

The thermal energy, which tends to flow from the 300K ambient to the coldest portion of the system in the liquid refrigerant storage volume 20 at 4K, is intercepted first by the 90K radiation barrier 24 and is drawn off by the closed cycle vapor compression system.

Heat flowing inwardly due to the gradients between the thermal intercept 24, thermal intercept 22, and the liquid helium in the volume 20, is intercepted by the inner thermal barrier 22.

Thereby, the amount of heat that reaches the liquid refrigerant in the storage volume 20 is very substantially reduced, and the amount of liquid refrigerant that boils off to maintain the magnet at the desired cryogenic temperature is substantially less than the boil off that would occur without active cooling provided at the 90K barrier using the closed cycle refrigeration system. Additionally, a single stage compressor system as described in U.S. Pat. No. 5,337,572 is suitable for this application and uses substantially less power than the two stage GM cycle refrigerators of the prior art.

Heat intercepted by the inner thermal barrier 22 flows to the heat exchange element 28 which is cooled by the evaporated helium gas that leaves the storage volume 20 at approximately 4K and becomes superheated as it moves through the neck tube 26 to reach the external ambient 42.

Figure 2:
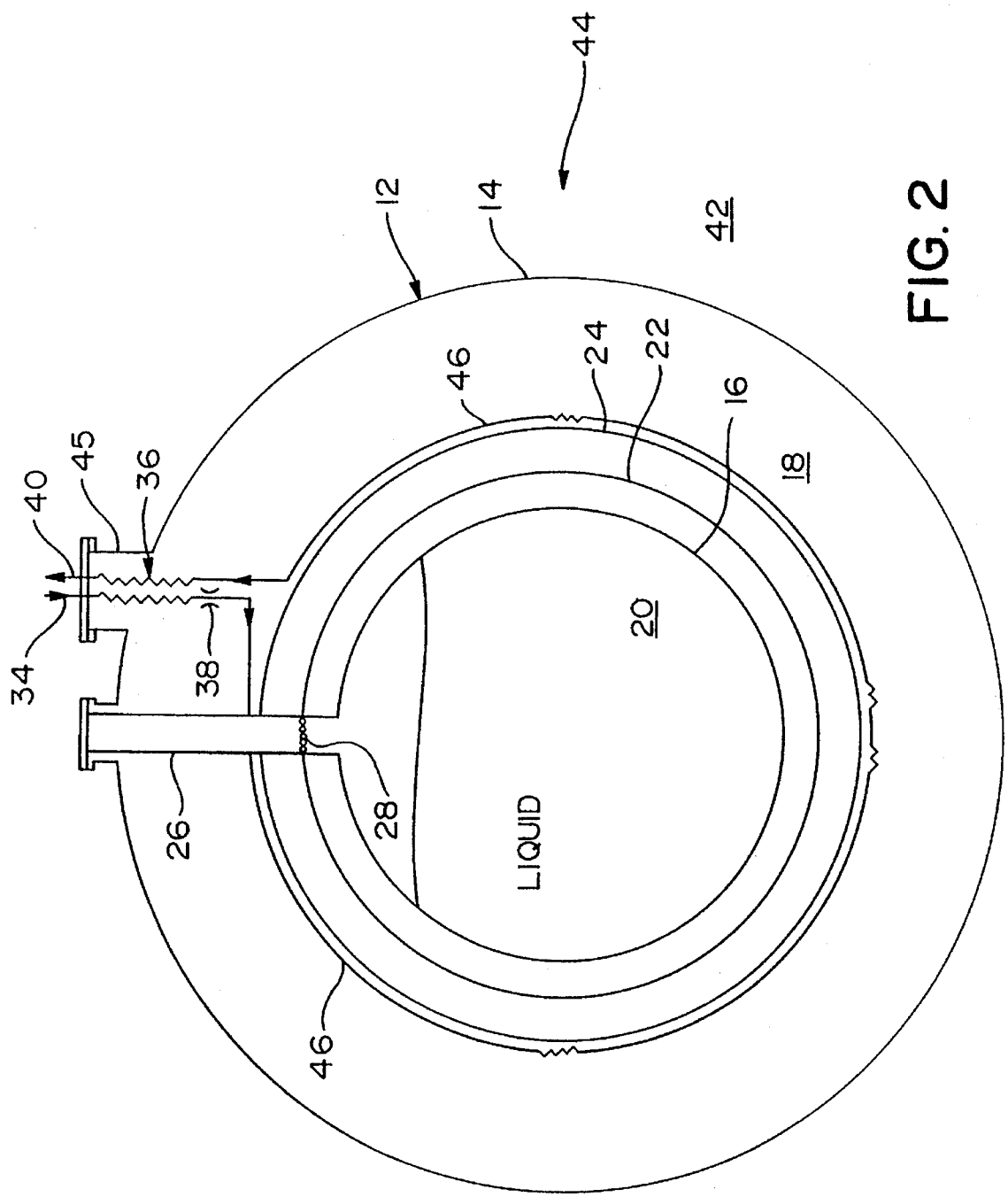
FIG. 2 is a schematic of an alternative embodiment of a liquid helium cryostat with a throttle cycle refrigerator in accordance with the invention.

FIG. 2 is an alternative embodiment of a cryostat system 44 in accordance with the invention, wherein elements that are the same and perform the same function as in FIG. 1 are given the same reference numerals. This practice with regard to reference numerals is followed in describing each embodiment.

In the embodiment of system 44, the counterflow heat exchanger 36 and throttle device 38 of an external closed cycle refrigerant system are located within the evacuated space 18 of the housing 12. A separate port 45 allows for inflow of refrigerant at the inlet 34 and outflow at the outlet 40. The neck tube 26 includes the heat exchange element 28 that thermodynamically connects with the inner thermal intercept 22 as in FIG. 1.

Cold low pressure refrigerant leaving the expansion device 38 flows through tracer tubes 46 that are thermally joined to the outer surface of the outer thermal radiation barrier 24, and also engage the neck tube 26 and support struts, etc. (not shown). Using known techniques, the necessary thermal bond between the tracer tubes 46 and the radiation shield 24 may be provided.

Thus, the 90K radiation shield 24 is cooled to intercept inflow of heat from ambient 42. Heat flow to the 35K inner thermal intercept 22 is removed by helium gas that boils from the liquid in the storage volume 20 and vents through the neck tube 26 to ambient 42, as described above.

Figure 3:
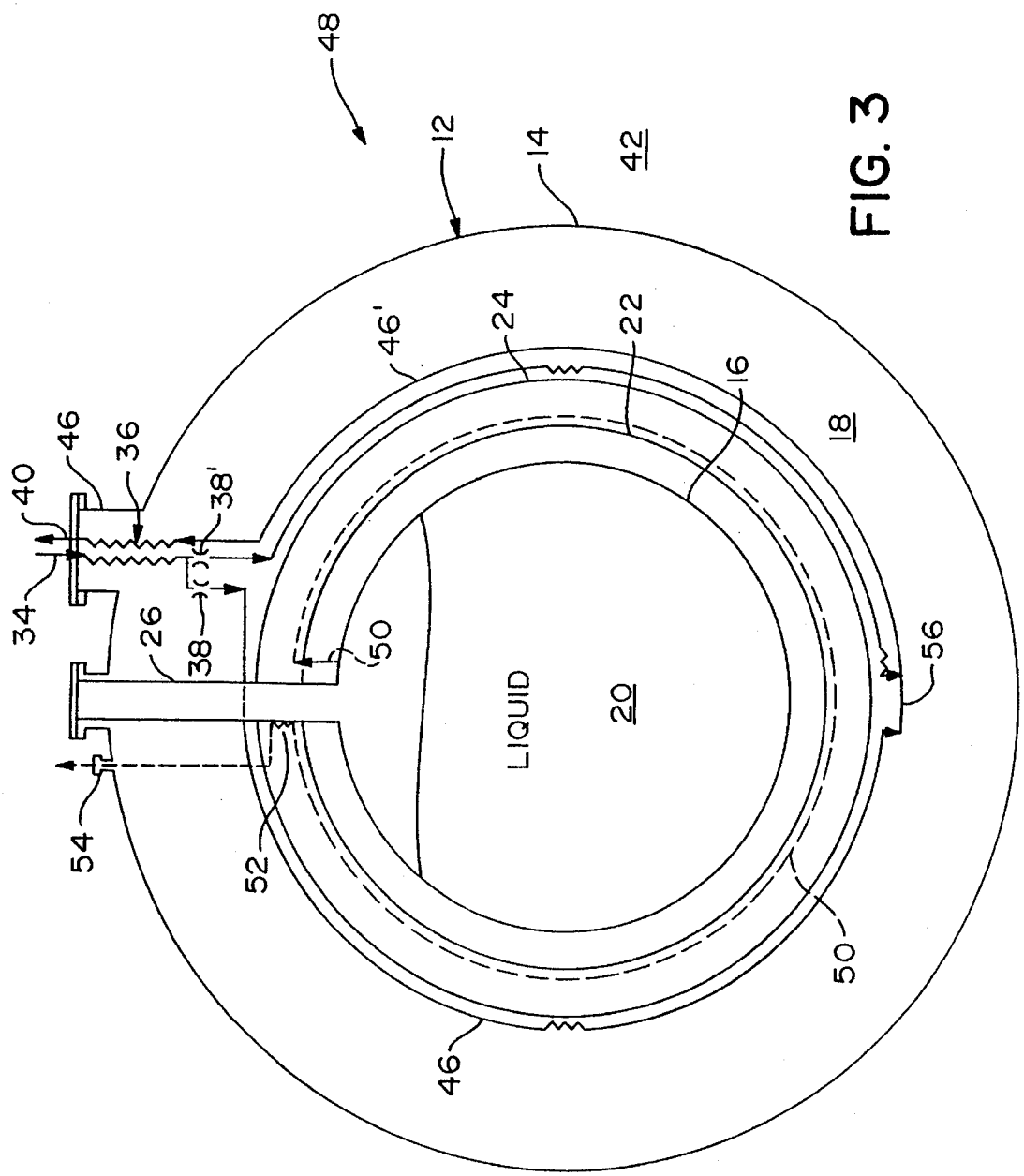
FIG. 3 is a schematic of another alternative embodiment of a liquid helium cryostat with throttle cycle refrigerator.

In FIG. 3, another embodiment of a cryostat system 48 in accordance with the invention is similar to the embodiment of FIG. 2. However, in FIG. 3, the opening in the neck tube 26 is used only for filling the refrigerant storage volume 20 with liquid refrigerant and for entry of electrical leads (not shown) to the interior of the cryostat. Liquid refrigerant evaporated in the storage volume 20, leaves that cold region through tubing 50 (indicated with broken lines) as gas, and flows through this tubing that is thermally bonded to the inner thermal barrier 22 to thereby cool the barrier 22 and intercept heat, at less than 35K when helium is the liquid refrigerant.

The tubing 50 that holds the boil-off gas is also brought into thermal contact with support struts (not shown) and the neck tube 26 as indicated at the heat station 52. The vent gas leaves the housing 12 through a vent fitting 54. Because the boil-off gas is brought into more extended and direct contact with the inner thermal intercept 22, the thermal barrier 22 can be of lighter construction. The thermal energy has a lesser distance to travel to reach the boil-off gas in the embodiment of FIG. 3 as compared to the embodiments in FIGS. 1 and 2.

In FIG. 3, the high pressure chilled refrigerant leaving the heat exchanger 36 located in the evacuated space 18 is split into two paths and flows through parallel throttle devices 38, 38'. The tracer tubes 46, 46' carrying the refrigerant, now at a low pressure, cool the outer thermal intercept 24 before joining together at 56 for return to the counterflow heat exchanger 36 and to the remainder of the closed cycle vapor compression refrigeration unit (not shown).

More than two parallel paths 50 may be used for the closed cycle refrigerant flow in alternative embodiments. Also, division of refrigerant flow into separate paths may be effected downstream of a single throttle device 38. Use of parallel circuits for refrigerant flow reduces pressure drop and enables use of smaller diameter tubing, which is an advantage in cryostat construction.

Figure 4:
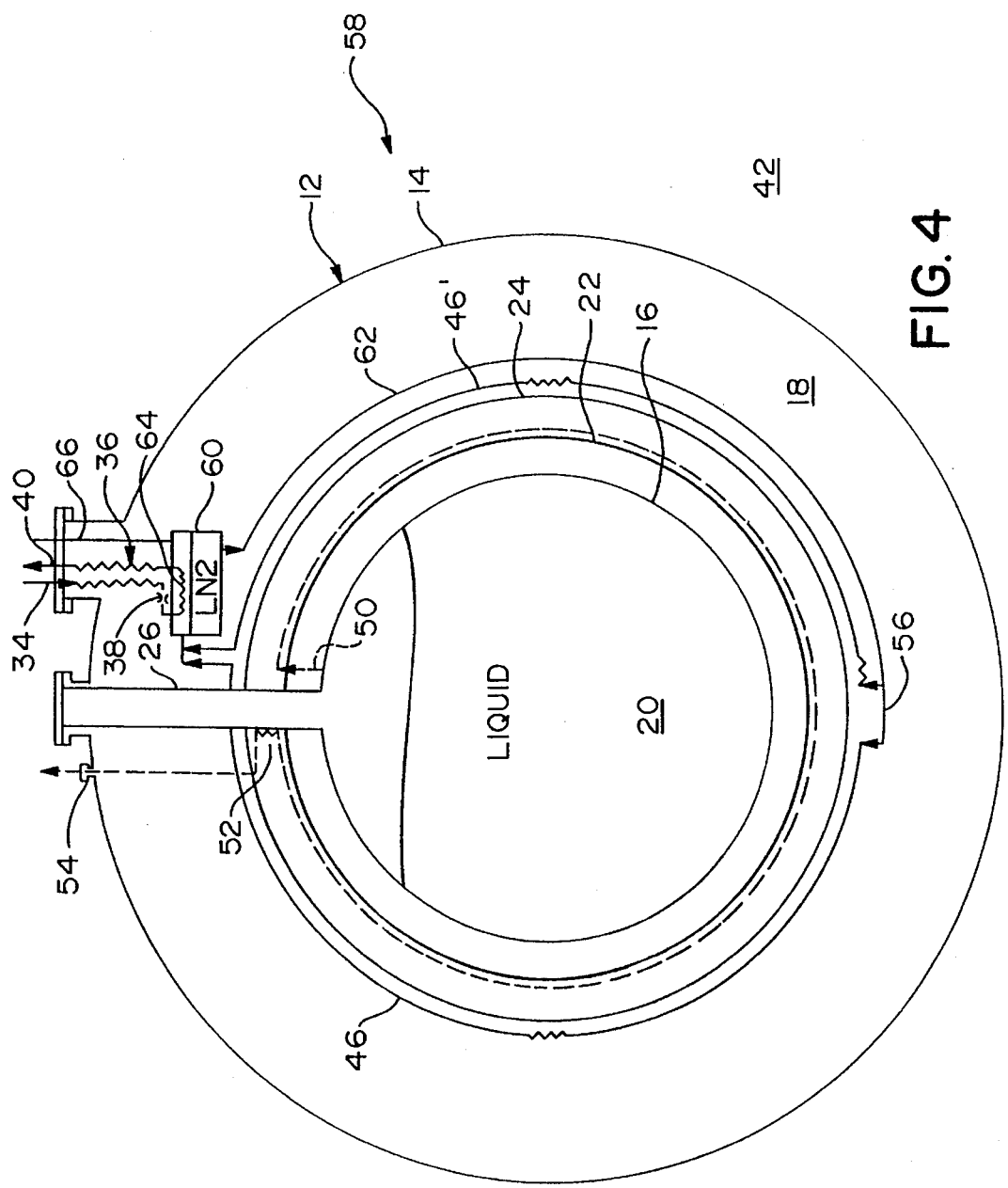
FIG. 4 is a schematic of yet another liquid helium cryostat with throttle cycle refrigerator in accordance with the invention.

The embodiment of a cryostat system 58 in accordance with the invention, illustrated schematically in FIG. 4, provides a flow path for boiled off liquid refrigerant that is the same as that in the embodiment of FIG. 3. However, in the cryostat system 58, the outer thermal barrier 24 is cooled by a flow of liquid nitrogen in the parallel flow tracer tubes 46, 46'.

Liquid nitrogen is stored in a closed vessel 60 mounted within the evacuated space 18 of the housing 12. The vessel 60 is at a high physical elevation such that liquid nitrogen feeds into the tracer tubes 46, 46' from the bottom through a down-flow feeder tube 62, which connects to the liquid region of the vessel 60.

No pumping means is provided in the liquid nitrogen path. Refrigerant circulates in the tracer tubes 46, 46' and in the down flowing feeder tube 62 by natural convection. Liquid nitrogen entering the tracer tubes 46, 46' at the bottom absorbs heat from the outer 90K thermal intercept 24, is thereby warmed, expands and rises naturally due to its lower density. The rising liquid is replaced by colder, more dense fluid entering at the bottom from the feeder tube 62. As the fluid in the tubes 46, 46' rises, its pressure drops and gas bubbles may form and rise to the top of the tubing and enter the vessel 60 and collect above the liquid level of nitrogen. A heat exchanger 64 above the liquid within the vessel 60 is maintained at a temperature sufficiently low to recondense the gaseous nitrogen to liquid. Thereby the outer 90K thermal barrier 24 is cooled and intercepts heat by a continuous naturally convective flow of liquid nitrogen.

The heat exchanger 64 is cooled by high pressure refrigerant entering at the inlet 34 and passing through the throttle device 38, as described above, before passing through the heat exchanger 64. The counterflow heat exchanger 36 carries the high pressure refrigerant flow to the throttle device 38 and returns low pressure refrigerant, which has passed through the heat exchanger 64 to the inlet of a compressor (not shown) in the closed cycle refrigeration system.

A tubing 66 connects the gas filled portion of the vessel 60 with external ambient 42 and serves for venting and filling the vessel 60 as required.

Such a system wherein the outer thermal intercept 24 is cooled by natural convection reduces mechanical disturbances within the cryostat while providing a highly controllable temperatures at the thermal intercepts 22, 24.

Figure 5:
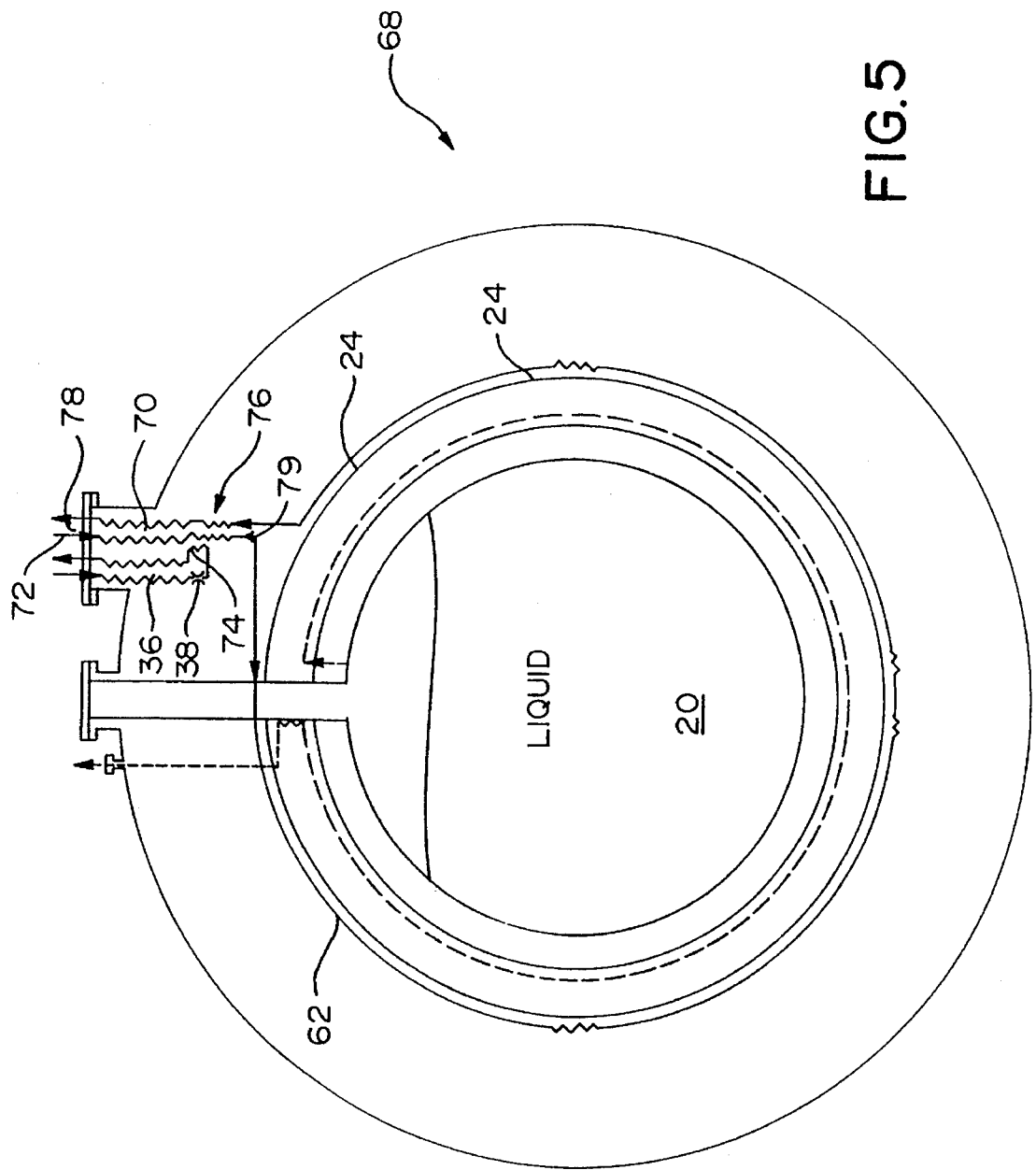
FIG. 5 is a schematic drawing of another liquid helium cryostat with a throttle cycle refrigerator in accordance with the invention.

In the embodiment of FIG. 5, the cryostat system 68 is similar to that in FIG. 4 with regard to the flow of gaseous helium that boils off from the 4K liquid helium in the storage volume 20. However, in FIG. 5, the liquid nitrogen that cools the outer thermal barrier 24 is moved by forced circulation provided by a nitrogen compressor (not shown). The nitrogen compressor is part of a second closed cycle refrigeration system that provides high pressure nitrogen to a counterflow heat exchanger 70 via an inlet 72.

Refrigerant leaving the counterflow heat exchanger 70 is further cooled in a second heat exchanger 74 so that liquid nitrogen at about 70K is circulated in the feeder tube 62 that cools the outer radiation barrier 24. The liquid nitrogen then passes through another counterflow heat exchanger 76, exchanging heat with the nitrogen leaving the heat exchanger 74. The refrigerant then flows through the counterflow heat exchanger 70, leaves the cryostat via the outlet 78 and returns to the nitrogen compressor (not shown) to complete its cycle.

Use of the throttle cycle refrigerator circuit including the heat exchangers 36, 74 in conjunction with a closed nitrogen cycle including the heat exchangers 70, 74, 76 as a two stage refrigerator, provides refrigeration for the outer shield 24 at a lower temperature than is provided in the other embodiments. The nitrogen compressor in such a construction would have a delivery, that is, a supply pressure of about 400 kPa (4.0 atmospheres) and a return pressure of about 35 kPa (0.35 atmospheres) to enable the nitrogen to be condensed by the heat exchanger 74 at 90K and have the liquid nitrogen boil at 70K after passing through a throttle device 79.

Use of the nitrogen compressor also permits the liquid nitrogen to be circulated around the outer thermal barrier 24 in smaller tubing 62 than is possible if natural convection is utilized. The lower temperature, i.e., 70K as compared to 90K, reduces the liquid helium boil off rate significantly. As stated, the means for intercepting heat at 35K is the same as in the embodiment of FIG. 4.

A variation of the cryostat system 68 of FIG. 5 is in using a mixture of nitrogen with helium or a mixture of nitrogen, oxygen and helium in the closed cycle, which feeds the tube 62, to provide a temperature as low as 60K for the outer shield 24 while maintaining a higher return pressure to the nitrogen compressor. Helium boil-off is further reduced and compressor efficiency is improved.

Figure 6B:
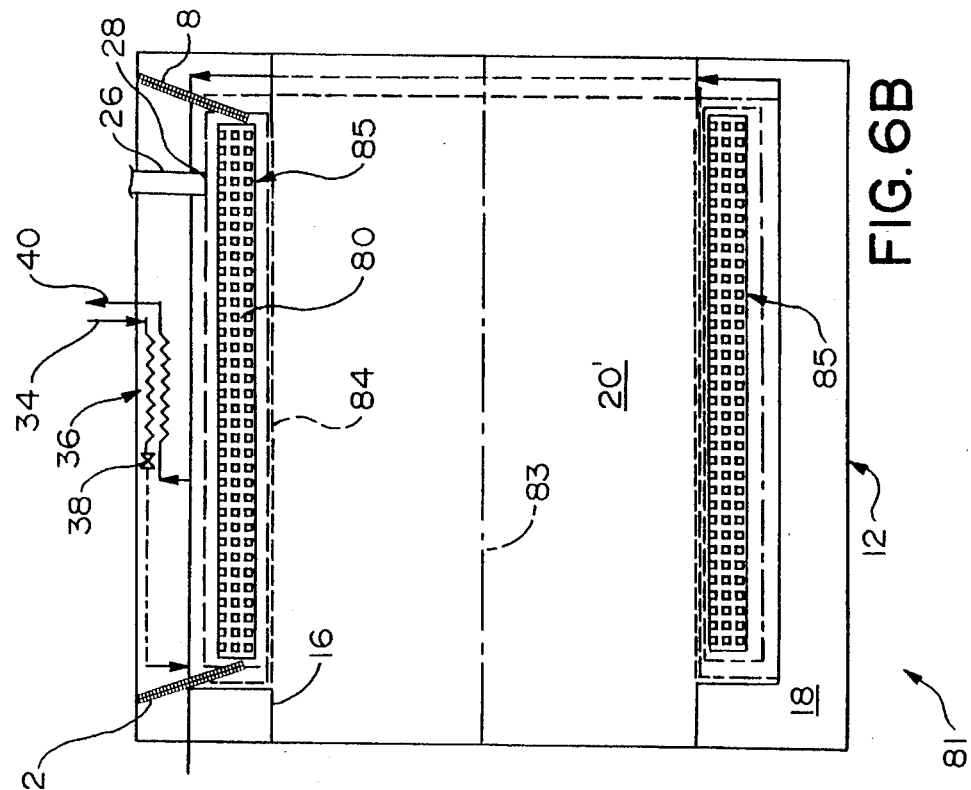
FIGS. 6A and 6B are respective end and side elevational views, in section, of a magnetic resonance imaging cryostat in accordance with the invention.
Figure 6A:
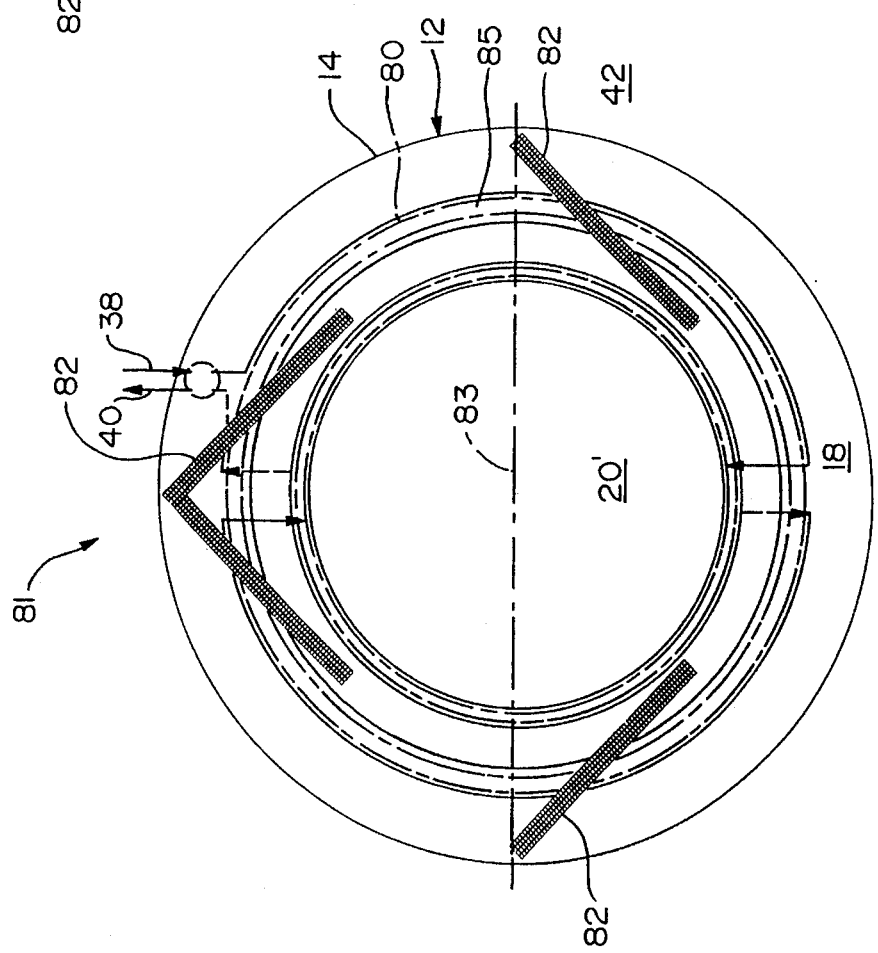

FIGS. 6A–C provide a semi-schematic illustration of a magnetic resonance imaging (MRI) construction incorporating the concepts of the embodiment illustrated schematically in FIG. 2. Each of the above embodiments (FIGS. 1–5) is adaptable to an MRI application.

An annular cylindrical superconducting magnet 80 is supported by struts 82 within the housing 12, with the longitudinal axis 83 of the magnet and housing assembly 81 being horizontal. Unlike the embodiments illustrated in FIGS. 1–5, the hollow center 20' of the housing is open to the ambient 42 and therein a patient may be positioned during magnetic resonance imaging.

The magnet 80, which is enclosed in a container 85 having an inner wall 86 and an outer wall 88, and is positioned within the evacuated space 18 of the housing 12 between the outer wall 14 and inner wall 16, includes superconducting wires 84 (FIG. 6B) formed into a coil in a known manner. A neck tube 26 connects to the container 85 from the top of the housing 12, and the container 85 that surrounds the magnet 80 is filled with liquid helium. Thus, the magnet is maintained around 4K when the helium is exposed to the external ambient 42 via the neck tube 26. Electrical leads to the magnet are located in the vent tube 26.

Within the evacuated space 18, the outer thermal radiation barrier 24 is positioned between the radially outer wall 14 of the housing 12 and the outer wall 88 of the superconducting magnet 80 in its helium filled container 85. The shield 24 completely surrounds the magnet 80, including its axial ends, and extends as a barrier between the inner wall 16 of the housing 12 and the inner wall 86 of the container 85 enclosing the magnet 80.

The radially inner thermal barrier or intercept 22 is positioned between the outer wall 88 of the magnet-holding container 85 and the outer thermal radiation barrier 24, as shown schematically in FIG. 2. The intercept 22 is also between the outer barrier 24 and the inner wall 86 of the magnet 80 in its helium filled container 85, and is at the axial ends of the magnet. The inner barrier at 35K connects to the heat exchange element 28 that is located in the neck tube 26, as described above. Therefore, the temperature of the inner thermal barrier 22 is maintained by heat conduction in the barrier 22 and heat transfer between the element 28 and gaseous helium that is boiled-off from the liquid helium that surrounds the magnet 80.

Tracer tubes 46 connect to the surface of the outer thermal barrier 24, and refrigerant from the closed cycle refrigeration system, which has its moving parts located externally of the housing 12, is circulated to maintain the thermal barrier 24 around its desired temperature of 90K. The throttle device 38 and counterflow heat exchanger 36 are located within the evacuated space 18 and carry high pressure refrigerant from the compressor (not shown) by way of the inlet 34. The remotely located compressor delivers a mixed refrigerant gas at ambient temperature to the heat exchanger 36 at a pressure about 2 Mpa and receives the return gas at about 0.2 Mpa. The refrigerant in the closed cycle circulates through the tracer tubes 46 and returns to the compressor by way of the counterflow heat exchanger 36 and the housing outlet 40. The 90K refrigerant circuit also cools the neck tube 26, support struts 82, wiring (not shown), etc. Thus, the apparatus 81 of FIGS. 6A–C operates on the same refrigeration principles and with similar constructions, as in FIG. 2.

It should be understood that in alternative embodiments in accordance with the invention, a single stage throttle cycle refrigeration system can be used to maintain the outer heat shield 24 at other temperatures, e.g., within a range of 75K to 120K by operating at different pressures and/or using different refrigerant mixtures.

Also, in an alternative embodiment in accordance with the invention two or more refrigerators and cooling circuits may be operated in parallel for the sake of redundancy. Also, a single stage throttle cycle refrigerator, which produces two temperatures may be used to provide both 90K and 200K simultaneously, as illustrated in FIG. 7.

FIG. 7 is a cryostat system that is a variation of the system shown in FIG. 2. The low pressure side of the heat exchanger 36 has a branch 36' to make thermal contact at 37 with the neck tube 26. Thus, an intermediate heat station may be provided between the 90K temperature of the radiation barrier 34 and ambient temperature. This second source of cooling for the neck tube 26 further isolates the heat exchange element 28 that is thermodynamically associated with the inner thermal barrier 22. In all other respects, the embodiment of FIG. 7 is the same as the embodiment of FIG. 2.

It should be noted that when the storage volume 20 is filled with liquid helium, the inner radiation barrier 22 is maintained at about 35K. However, it is possible to use other refrigerants in the volume 20 to achieve other temperatures. For example, when liquid neon is used in the storage volume 20, the inner radiation barrier 22 may be maintained at a temperature of about 55K, and when liquid nitrogen is used in the volume 20, the inner barrier 22 may be maintained at a temperature about 82K.

As stated, different refrigerants and refrigerant mixtures in association with the heat exchanger 36 and throttle device 38 may be used to produce different temperatures at the outer radiation barrier 24.

The constructions of FIGS. 2–4 have an advantage in that the helium cooling system, including use of the vented helium gas to cool the inner shield, and the closed cycle refrigeration circuits are thermally isolated from each other. Thereby, the vapor compression cycle may be shut down and allowed to warm up without interfering with operation of the liquid helium/boil off refrigeration system.

It will thus be seen that the objects set forth above and those made apparent from the preceding description are efficiently attained, and since certain changes may be made in the above constructions without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A cryostat system for maintaining a load at a predetermined cryogenic temperature, comprising:

a chamber for containing in an interior volume a liquid cryogenic refrigerant, said chamber having a vent tube connected between said interior volume and an ambient environment of said cryostat;

an evacuated housing surrounding said chamber, said vent tube extending through an evacuated space within said housing to said ambient environment;

a first thermal intercept positioned within said evacuated space between said chamber and said ambient environment, a first heat transfer relationship existing between said first thermal intercept and said vent tube, heat from said first thermal intercept being transferred to gaseous refrigerant which, in use, boils off from said liquid in said chamber and flows through said vent tube to said ambient environment;

a second thermal intercept positioned within said evacuated space between said first thermal intercept and said ambient environment;

a refrigerant evaporator within said evacuated space, a second heat transfer relationship existing between said second thermal intercept and said evaporator, heat from said second thermal intercept being transferred, in use, to refrigerant in said evaporator, said evaporator, in use, being part of a closed cycle vapor compression refrigeration unit;

a temperature for said load being determined by a boiling temperature of said liquid refrigerant in said vented chamber, said first thermal intercept being generally warmer than said load temperature, said second thermal intercept being generally warmer than said first thermal intercept and colder than a temperature of said ambient environment.

2. A cryostat system as in claim 1, further comprising a heat exchanger and throttle device in said evacuated space, said heat exchanger having a high pressure path for connection at one end to a refrigeration compressor of said refrigeration unit and at a second end to an inlet to said throttle device, an outlet of said throttle device connecting to an inlet of said evaporator, an outlet of said evaporator connecting to an inlet of a low pressure path of said heat exchanger, an outlet of said low pressure path being for connection to an inlet of said compressor, a third heat exchange relationship existing between said high pressure path and said low pressure heat exchanger path.

3. A cryostat system as in claim 2, wherein said heat exchanger and said throttle device are in said vent tube.

4. A cryostat system as in claim 2, wherein said low pressure path of said heat exchanger includes a branch making thermal contact with said vent tube at a position between said second thermal intercept and said ambient environment, whereby refrigerant flow from said closed cycle vapor compression refrigeration unit establishes two temperature levels for said second thermal intercept and for said vent tube, respectively.

5. A cryostat system as in claim 1, and further comprising a superconducting magnet in said chamber for at least partial submersion in said liquid refrigerant in use of said system.

6. A cryostat system as in claim 5, wherein said chamber, magnet and housing are generally annular cylinders, said chamber being within said housing, said magnet being within said chamber, said first and second thermal intercepts entirely surrounding said chamber including axial ends of said chamber.

7. A cryostat system as in claim 6, further comprising a single stage compressor unit, a heat exchanger and throttle device being connected in series with a high pressure outlet of said compressor unit to deliver low pressure refrigerant flow to said evaporator, an outlet of said evaporator being connected to a low pressure inlet of said compressor unit via said heat exchanger wherein low pressure refrigerant returning to said compressor unit exchanges heat with high pressure refrigerant flowing from said compressor unit to said throttle device.

8. A cryostat system as in claim 5, further comprising a single stage compressor unit, a heat exchanger and throttle device being connected in series with a high pressure outlet of said compressor unit to deliver low pressure refrigerant flow to said evaporator, an outlet of said evaporator being connected to a low pressure inlet of said compressor unit via said heat exchanger wherein low pressure refrigerant returning to said compressor unit exchanges heat with high pressure refrigerant flowing from said compressor unit to said throttle device.

9. A cryostat system as in claim 1, wherein said evaporator is within said vent tube, heat from said second thermal intercept reaching said evaporator by conduction through said vent tube.

10. A cryostat system as in claim 9, further comprising a heat exchange element within said vent tube, said heat exchange element being cooled by said vented refrigerant, heat from said first thermal intercept reaching said heat exchange element in said first heat transfer relationship by conduction through said vent tube.

11. A cryostat system as in claim 1, further comprising a heat exchange element within said vent tube, said heat exchange element being cooled by said vented refrigerant, heat from said first thermal intercept reaching said heat exchange element in said first heat transfer relationship by conduction through said vent tube.

12. A cryostat system as in claim 1, wherein said evaporator is directly in thermal contact with a surface of said second thermal intercept.

13. A cryostat system as in claim 12, wherein said evaporator includes tubing connected directly and in thermal contact with a surface of said second thermal intercept, said refrigerant flowing through said tubing.

14. A cryostat system as in claim 13, wherein said evaporator tubing is divided into at least two parallel flow paths, said parallel flow paths being connected to the high pressure side of said heat exchanger by one of a common throttle device and a respective throttle device for each said flow path.

15. A cryostat system as in claim 1, further comprising a port providing access from said ambient environment to said evacuated space within said housing, a heat exchanger and throttle device in said evacuated space, said heat exchanger having a high pressure path for connection at one end via said port to a refrigeration compressor and at a second end to an inlet to said throttle device, an outlet of said throttle device connecting to an inlet of said evaporator, an outlet of said evaporator connecting to an inlet of a low pressure path of said heat exchanger, an outlet of said low pressure path being for connection via said port to an inlet of said compressor, a third heat exchange relationship existing between said high pressure path and said low pressure heat exchanger path, said evaporator being directly in thermal contact with a surface of said second thermal intercept.

16. A cryostat system as in claim 1, wherein said vent tube includes a boil-off refrigerant gas circuit in direct thermal contact with a surface of said first thermal intercept to establish said first heat transfer relationship, said boil-off refrigerant gas circuit allowing flow of said vent gas between said chamber and ambient to remove heat from said first thermal intercept.

17. A cryostat system for maintaining a load at a predetermined cryogenic temperature, comprising:

a chamber for containing in an interior volume a liquid cryogenic refrigerant, said chamber having a vent tube connected between said interior volume and an ambient environment of said cryostat;

an evacuated housing surrounding said chamber, said vent tube extending through an evacuated space within said housing to said ambient environment;

a first thermal intercept positioned within said evacuated space between said chamber and said ambient environment, a first heat transfer relationship existing between said first thermal intercept and said vent tube, heat from said first thermal intercept being transferred to gaseous refrigerant which, in use, boils off from said liquid in said chamber and flows through said vent tube to said ambient environment;

a second thermal intercept positioned within said evacuated space between said first thermal intercept and said ambient environment;

a refrigerant evaporator within said evacuated space, a second heat transfer relationship existing between said second thermal intercept and said evaporator, heat from said second thermal intercept being transferred, in use, to liquid nitrogen refrigerant in said evaporator, said evaporator being part of a refrigeration circuit wherein said liquid nitrogen flows by natural convection through said evaporator;

a temperature for said load being determined by a boiling temperature of said liquid refrigerant in said vented chamber, said first thermal intercept being generally warmer than said load temperature, said second thermal intercept being generally warmer than said first thermal intercept and colder than a temperature of said ambient environment.

18. A cryostat system as in claim 17, further comprising a storage tank elevated above said evaporator, said liquid nitrogen flowing by gravity to a lower portion of said evaporator from said storage tank, said liquid rising in said evaporator by natural convection, gaining heat to cool said evaporator, and returning to said storage tank, a cooler in said storage tank cooling said returning nitrogen, said cooler being connected in circuit to an external vapor compression unit that rejects said heat from said evaporator.

19. A cryostat system as in claim 17, wherein said vent tube includes a boil-off refrigerant gas circuit, said boil-off refrigerant gas circuit being in direct thermal contact with a surface of said first thermal intercept, heat from said first thermal intercept being transferred to gaseous refrigerant in said boil-off refrigerant gas circuit.

20. A cryostat system for maintaining a load at a predetermined cryogenic temperature, comprising:

a chamber for containing in an interior volume a liquid cryogenic refrigerant, said chamber having a vent tube connected between said interior volume and an ambient environment of said cryostat;

an evacuated housing surrounding said chamber, said vent tube extending through an evacuated space within said housing to said ambient environment;

a first thermal intercept positioned within said evacuated space between said chamber and said ambient environment, a first heat transfer relationship existing between said first thermal intercept and said vent tube, heat from said first thermal intercept being transferred to gaseous refrigerant which, in use, boils off from said liquid in said chamber and flows through said vent tube to said ambient environment;

a second thermal intercept positioned within said evacuated space between said first thermal intercept and said ambient environment;

a refrigerant evaporator within said evacuated space, a heat transfer relationship existing between said second thermal intercept and said evaporator, heat from said second thermal intercept being transferred, in use, to liquid nitrogen refrigerant in said evaporator, said evaporator being part of a liquid nitrogen refrigeration circuit wherein a first external refrigeration unit including a nitrogen compressor located externally of said housing delivers high pressure nitrogen to an inlet of a two-stage heat exchanger, said evaporator being connected to an outlet of a throttle device having its inlet connected to a high pressure outlet of said heat exchanger, nitrogen leaving said evaporator returning to a low pressure inlet of said nitrogen compressor via said two-stage heat exchanger, high pressure refrigerant flow from said nitrogen compressor to said throttle device exchanging heat with low pressure refrigerant flow from said evaporator to said nitrogen compressor;

a secondary heat exchanger for exchanging heat with said nitrogen at a location between said high pressure inlet and high pressure outlet of said two-stage heat exchanger, said liquid nitrogen in said two-stage heat exchanger being further cooled before entering said throttle device to achieve a reduced temperature of said second thermal intercept, said secondary heat exchanger being part of a throttle cycle refrigeration unit including a single stage compressor located outside said housing, a temperature for said load being determined by a boiling temperature of said liquid refrigerant in said vented chamber, said first thermal intercept being generally warmer than said load temperature, said second thermal intercept being generally warmer than said first thermal intercept and colder than a temperature of said ambient environment.

21. A cryostat stat system as in claim 20, wherein said vent tube includes a boil-off refrigerant gas circuit, said boil-off refrigerant gas circuit being in direct thermal contact with a surface of said first thermal intercept, heat from said first thermal intercept being transferred to gaseous refrigerant in said boil-off refrigerant gas circuit.

22. A cryostat system as in claim 20, wherein said two-stage heat exchanger and said throttle device are within said evacuated housing.

* * * * *